United States Patent
Nagai

[11] Patent Number: 6,020,607
[45] Date of Patent: Feb. 1, 2000

[54] SEMICONDUCTOR DEVICE HAVING JUNCTION FIELD EFFECT TRANSISTORS

[75] Inventor: Nobutaka Nagai, Tokyo, Japan

[73] Assignee: NEC Corporation, Tokyo, Japan

[21] Appl. No.: 08/603,261

[22] Filed: Feb. 20, 1996

[30] Foreign Application Priority Data

Feb. 21, 1995 [JP] Japan ............................. 7-032175

[51] Int. Cl.⁷ ................................................ H01L 29/72
[52] U.S. Cl. ...................... 257/266; 257/224; 257/286; 257/287; 257/270
[58] Field of Search .................................. 257/287, 270, 257/286, 224, 266

[56] References Cited

U.S. PATENT DOCUMENTS

| 5,057,883 | 10/1991 | Noda | 257/287 |
| 5,359,256 | 10/1994 | Gray | 257/22 |

FOREIGN PATENT DOCUMENTS

| 1377330 | 10/1966 | France . |
| 2 454 703 | 11/1980 | France . |
| 27 28532 A1 | 1/1979 | Germany . |
| 33 45 189 A1 | 6/1984 | Germany . |
| 60-257577 | 12/1985 | Japan . |
| 63-128769 | 1/1988 | Japan . |
| 1401276 | 7/1975 | United Kingdom . |

OTHER PUBLICATIONS

European Search Report, dated Aug. 5, 1997.
J. M.R. Danneels et al., "A New 4+4 Array of Active Bipolar Transistor Crosspoints", IEEE Journal of Solid–State Circuits, vol. SC–11, No. 6, pp. 779–783.

*Primary Examiner*—Edwards Wojciechowicz
*Attorney, Agent, or Firm*—Whitham, Curtis & Whitham

[57] ABSTRACT

An N⁻ type epitaxial layer is formed on a P type semiconductor substrate, and a P⁺ type insulative isolating layer is so formed as to reach the semiconductor substrate from the surface of the N⁻ type epitaxial layer to define a device forming region in the N⁻ type epitaxial layer. An N⁺ type source diffusion layer and an N⁺ type drain diffusion layer are formed on the N⁻ type epitaxial layer in the device forming region, apart from each other in one direction. A plurality of P⁺ type gate diffusion layers are formed between the N⁺ type source diffusion layer and N⁺ type drain diffusion layer, apart from one another in a direction perpendicular to the one direction. Channel regions for controlling the source-drain current are formed between the P⁺ type insulative isolating layer and the gate diffusion layer and between adjoining gate diffusion layers.

19 Claims, 5 Drawing Sheets

SEMICONDUCTOR DEVICE HAVING JUNCTION FIELD EFFECT TRANSISTORS

BACKGROUND OF THE INVENTION

1. Field of the Invention

The present invention relates to a semiconductor device having junction field effect transistors, and, more particularly, to a semiconductor device having junction field effect transistors, which can have the desired electric characteristics and do not affect other circuit elements on the same substrate.

2. Description of the Related Art

FIG. 1A is a plan view showing the structure of a conventional junction field effect transistor (FET), and FIG. 1B is a cross-sectional view along the line IB—IB in FIG. 1A. Hereinafter, this junction FET will be called "first prior art."

An N type epitaxial layer 22 having a thickness of approximately 3 μm is grown on a P type semiconductor substrate 21. A P⁺ type insulative isolating layer 28 is selectively formed on the surface of the N type epitaxial layer 22 in such a way as to reach the P type semiconductor substrate 21. This insulative isolating layer 28 defines a device region 20 where a junction FET is to be formed.

An N⁺ type source diffusion layer 23, an N⁺ type drain diffusion layer 24 and a P⁺ type gate diffusion layer 25 are selectively formed on the N type epitaxial layer 22. An insulating film 36 is formed on the N type epitaxial layer 22 and the insulative isolating layer 28. A source contact hole 32, a drain contact hole 33 and a gate contact hole 34 are selectively formed in the insulating film 36 at the positions which match with the N⁺ type source diffusion layer 23, N⁺ type drain diffusion layer 24 and P⁺ type gate diffusion layer 25.

A source electrode 29, a drain electrode 30 and a gate electrode 31 are respectively formed on the N⁺ type source diffusion layer 23, N⁺ type drain diffusion layer 24 and P⁺ type gate diffusion layer 25 at those portions exposed by the contact holes 32, 33 and 34. Therefore, the source electrode 29, drain electrode 30 and gate electrode 31 are electrically connected to the N⁺ type source diffusion layer 23, N⁺ type drain diffusion layer 24 and P⁺ type gate diffusion layer 25 via the contact holes 32, 33 and 34 formed in the insulating film 36.

The distances from N⁺ type source diffusion layer 23 and N⁺ type drain diffusion layer 24 to the P⁺ type insulative isolating layer 28, P⁺ type gate diffusion layer 25 and P type semiconductor substrate 21 are so determined as to satisfy the breakdown voltage (e.g., 10 V) that is demanded of this junction FET.

In the thus constituted junction FET 20, when a DC voltage is applied to the source electrode 29 and drain electrode 30, a current flows between both electrodes 29 and 30 because those electrodes are electrically connected via the N type epitaxial layer 22. As the minus gate voltage is applied to the gate electrode 31 and P type semiconductor substrate 21, a depletion layer region 27a on the side of the gate electrode 31 and a depletion layer region 27b on the side of the P type semiconductor substrate 21 expand by the field effect. As a result, the width L of the N type channel region 26 becomes narrower, making it difficult for the current to flow. As is apparent from the above, the migration of electrons between the source electrode 29 and drain electrode 30 can be controlled by changing the level of the voltage to be applied to the gate electrode 31.

Therefore, the depth of the P⁺ type gate diffusion layer 25 formed between the N⁺ type source diffusion layer 23 and the N⁺ type drain diffusion layer 24 to isolate them from each other is an important factor for the performance of the junction FET 20. More specifically, as the P⁺ type gate diffusion layer 25 becomes deeper, the width L of the N type channel region 26 becomes narrower and the current $I_{DSS}$ that flows when a constant voltage is applied between the source electrode 29 and the drain electrode 30 becomes smaller. When the voltage to be applied to the source electrode 29 and the drain electrode 30 is constant, the gate voltage $V_{GS}$ necessary to turn off the junction FET becomes smaller.

The width L of the N type channel region 26 also varies greatly by a variation in the thickness of the epitaxial layer 22. Because the uniformness of the thickness of the epitaxial layer 22 is poor, the electric characteristics of the device are significantly influenced by a change in film thickness.

Therefore, the first prior art needs a step of checking the electric characteristics by a monitor device or the like during the fabrication of the junction FET and adjusting the depth of the gate diffusion layer 25 by a heat treatment or the like to provide the desired channel region width L.

The device manufacturing process suffers not only an increase in the number of steps but also the influence on the electric characteristics of other devices in the case of an LSI circuit on which those devices are simultaneously manufactured.

In an LSI circuit having NPN bipolar transistors or the like formed on the same substrate as this junction FET is formed, the impurity concentration of the P type silicon substrate 21 should be set as low as approximately $1 \times 10^{15}$ cm⁻³ to reduce the collector capacitances of the NPN bipolar transistors. This scheme can improve the operation speed of the device and the collector breakdown voltage.

According to the junction FET of the first prior art, however, if the impurity concentration of the P type silicon substrate 21 is set low, it becomes difficult to increase the depletion layer region 27b to the desired range. This is because the impurity concentration of the P type silicon substrate 21 is lower than that of the N type epitaxial layer 22, so that the depletion layer formed by the PN junction between the P type silicon substrate 21 and the N type epitaxial layer 22 mainly expands toward the P type silicon substrate 21 and does not expand toward the N type epitaxial layer 22 much. Therefore, the mutual conductance ($g_m$) representing the amount of a change in drain current ($\Delta I_{DS}$) with respect to the amount of a change in gate voltage ($\Delta V_G$) becomes smaller. In other words, even if the gate voltage to be applied is changed greatly, there is a small change in drain current so that the current control efficiency becomes poor.

As a junction FET with another structure, a junction FET with a vertical structure which has the source electrode and drain electrode formed on the top and back surfaces of a substrate is disclosed in, for example, Unexamined Japanese Patent Publication No. Sho 63-128769.

FIG. 2 is an exemplary cross-sectional view showing the structure of a junction FET with a vertical structure. This junction FET will be called "second prior art."

A drain region 42 made of an N type semiconductor is formed on the entire back surface of an N type semiconductor substrate 41, and a plurality of grooves 47 are formed inward from the surface of the N type semiconductor substrate 41 at the depth not deep enough to reach the drain region 42. A P type impurity is doped inside the N type semiconductor substrate 41 from all the grooves 47, forming P+ type gate diffusion layers 44 in such a way as to surround the grooves 47. N+ type source diffusion layers 43 are formed on the top surface of the N type semiconductor substrate 41 between the P+ type gate diffusion layers 44 in such a way as not to contact the individual P+ type gate diffusion layers 44.

An insulating film 48 is formed on the N type semiconductor substrate 41, and gate electrode holes 48a and source electrode holes 48b are respectively formed in the insulating film 48 at the positions matching with the openings 47a of the individual grooves 47 and the N+ type source diffusion layers 43.

Further, all the grooves 47 are filled with gate electrodes 46 which slightly protrude from the surface of the insulating film 48. Source electrodes 45 are formed on the source diffusion layers 43 which is exposed by the source electrode holes 48b. Like the gate electrodes 46, those source electrodes 45 slightly protrude from the surface of the insulating film 48. Therefore, the gate electrodes 46 are electrically connected to the P+ type gate diffusion layers 44, and the source electrodes 45 to the N+ type source diffusion layers 43.

The thus constituted junction FET has substantially the same operation as the first prior art except that the direction of the current flow differs from that of the first prior art. When a DC voltage is applied to the source electrodes 45 and the drain region 42, a current flows between the source electrodes 45 and the drain region 42 because they are electrically connected via the N type semiconductor substrate 41. As the minus gate voltage is applied to each gate electrode 46, the width of a channel region 49 between the adjoining gate electrodes 46 become narrower by the field effect, making it difficult for the current to flow.

In the junction FET of the second prior art, the migration of electrons between the source electrodes 45 and drain region 42 can likewise be controlled by changing the level of the voltage to be applied to the gate electrodes 46.

In the junction FET of the second prior art unlike the first prior art, the width of the channel region 49 between the adjoining gate electrodes 46 is not influenced by the film thickness of the N type semiconductor substrate 41, so that the electric characteristics can be improved.

As the drain region 42 is formed at the back of the N type semiconductor substrate 41 in the second prior art, however, the substrate potential varies when this junction FET is turned on or in an operation mode where a high current flows through the substrate 41. When circuit elements like NPN bipolar transistors besides the junction FET are formed on the same substrate, the NPN bipolar transistors or the like may malfunction.

Because the source diffusion layers 43 is formed between the adjacent gate diffusion layers 44 in the second prior art, this source diffusion layers 43 prevent the interval between the grooves 47 or the width of the channel region 49 from becoming narrower than a certain value, which is a design restriction. Further, when the depths of the grooves 47 become uneven, the lengths of the channel regions 49 in the depth direction of the grooves 47 also become uneven, thus causing a variation in the electric characteristics of the junction FET.

SUMMARY OF THE INVENTION

Accordingly, it is a primary object of the present invention to provide a semiconductor device having a junction FET, which allows a channel region having the desired width and length to be formed without requiring extra steps, thereby preventing the electric characteristics of the device from varying.

It is the secondary object of this invention to provide a semiconductor device which can have the desired channel shape and does not adversely affect other circuit devices on the same substrate when an ON current flows.

A junction FET according to one aspect of this invention comprises:

a semiconductor layer of first conductivity type;

a source diffusion layer of first conductivity type selectively formed on a surface of said semiconductor layer;

a drain diffusion layer of first conductivity type selectively formed on said surface of said semiconductor layer, apart from said source diffusion layer in first direction; and a plurality of gate diffusion layers of a second conductivity type formed between said source diffusion layer and said drain diffusion layer, apart from one another in a direction perpendicular to said first direction, with channel regions formed between said gate diffusion layers.

This semiconductor device further may comprise an insulating film formed on said semiconductor layer, said insulating film having first gate contact holes at positions matching with said gate diffusion layers; and a gate electrode film in contact with all of said gate diffusion layers via said first gate contact holes.

Further, said source diffusion layer and drain diffusion layer may be so formed as to extend in a direction perpendicular to said first direction, and said gate diffusion layers may be so formed as to extend in said first direction.

The semiconductor layer may have a flat surface so that said source diffusion layer, drain diffusion layer and gate diffusion layers can be formed inward of said semiconductor layer from said surface thereof.

This semiconductor device may further have a semiconductor substrate of second conductivity type on which said semiconductor layer is formed by an epitaxial layer or a well region of first conductivity type.

Further, said gate diffusion layers may be so formed as to reach said semiconductor substrate from said surface of said semiconductor layer.

Furthermore, an insulative isolating layer of second conductivity type may be formed inward of said semiconductor layer from said surface thereof in such a way as to surround said source diffusion layer, drain diffusion layer and gate diffusion layers.

The insulating film may have a second gate contact hole at a position matching with said insulative isolating layer, and said gate electrode film may be in contact with said insulative isolating layer via said second gate contact hole, thereby allowing channel region to be formed between said gate diffusion layer and said insulative isolating layer of said second conductivity type.

A junction FET according to another aspect of this invention comprises:

a semiconductor layer of first conductivity type;

a source diffusion layer of first conductivity type selectively formed on a surface of said semiconductor layer;

a drain diffusion layer of first conductivity type selectively formed on said surface of said semiconductor layer, apart from said source diffusion layer in first direction;

a gate diffusion layer of second conductivity type formed between said source diffusion layer and said drain diffusion layer; and an insulative isolating layer of second conductivity type so formed as to surround said source diffusion layer, drain diffusion layer and gate diffusion layers, with channel regions formed between said insulative isolating layer and said gate diffusion layer.

According to this invention, as a plurality of gate diffusion layers become channel regions for controlling the source-drain current, the width and shape or the like of the channel regions can easily be controlled, thereby providing a junction FET having the desired electric characteristics.

As no source diffusion layer or the like is located between the gate diffusion layers, the channel width can be set freely in accordance with the desired characteristics.

Further, the drain current is controlled only by the gate diffusion layers or the depletion layer extending from the gate diffusion layers and $P^+$ type insulative isolating layer, and the depletion layer extending from the substrate or the like at the bottom hardly affects the drain current. Even in the case where other circuit elements are formed on the same substrate, therefore, a predetermined high mutual conductance can be acquired irrespective of the impurity concentration of the substrate that is needed for the circuit elements.

Furthermore, because the drain diffusion layer and gate diffusion layers are formed on the top side of the semiconductor layer in this invention, the substrate potential does not vary by the ON current (drain current) that is produced when this junction FET is turned on, and the electric characteristics of the other circuit elements are not affected.

BRIEF DESCRIPTION OF THE DRAWINGS

FIG. 5C is a cross-sectional view taken along the line VC—VC in FIG. 3;

DETAILED DESCRIPTION OF THE PREFERRED EMBODIMENTS

Preferred embodiments of the present invention will now be described specifically with reference to the accompanying drawings.

Figure 1A:
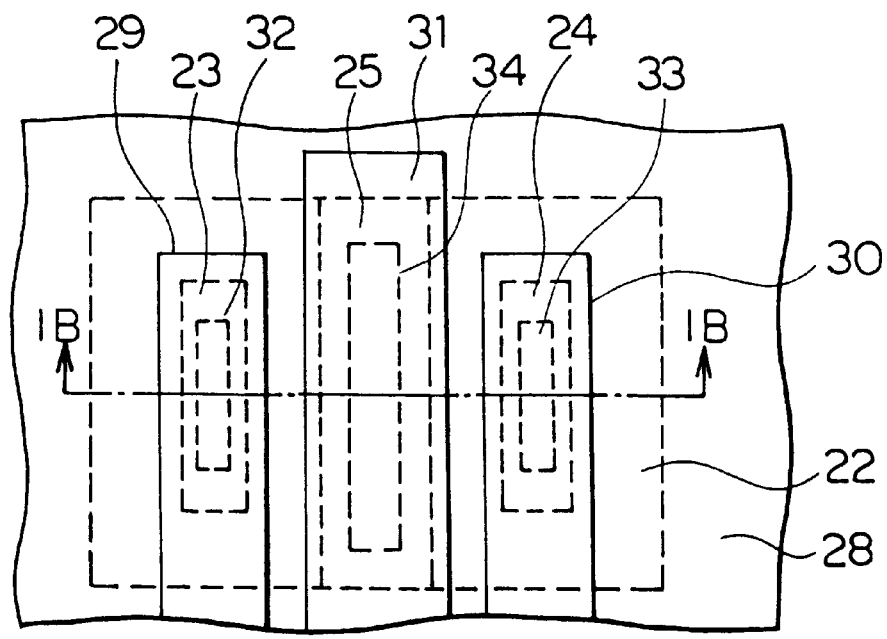
FIG. 1A is a plan view showing the structure of a conventional junction FET.
Figure 1B:
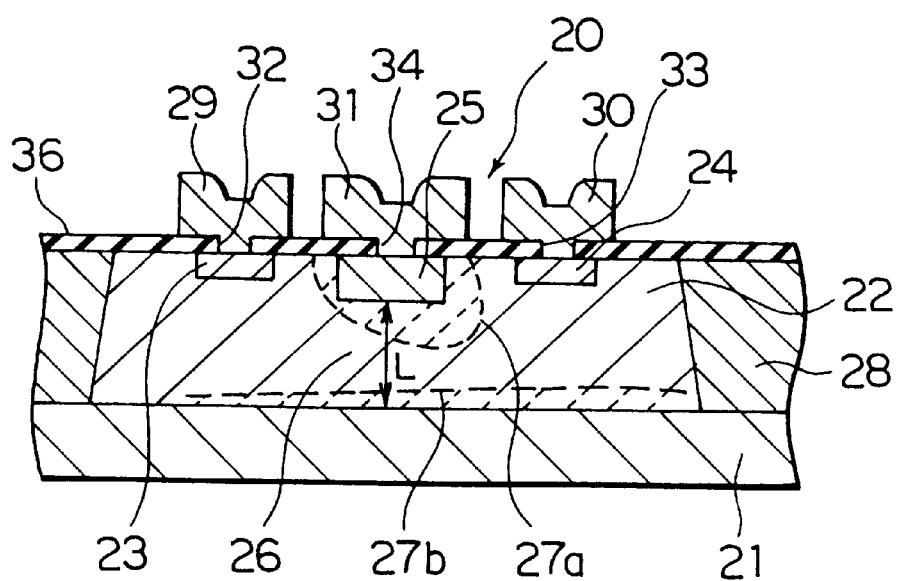
FIG. 1B is a cross-sectional view along the line IB—IB in FIG. 1A.
Figure 2:
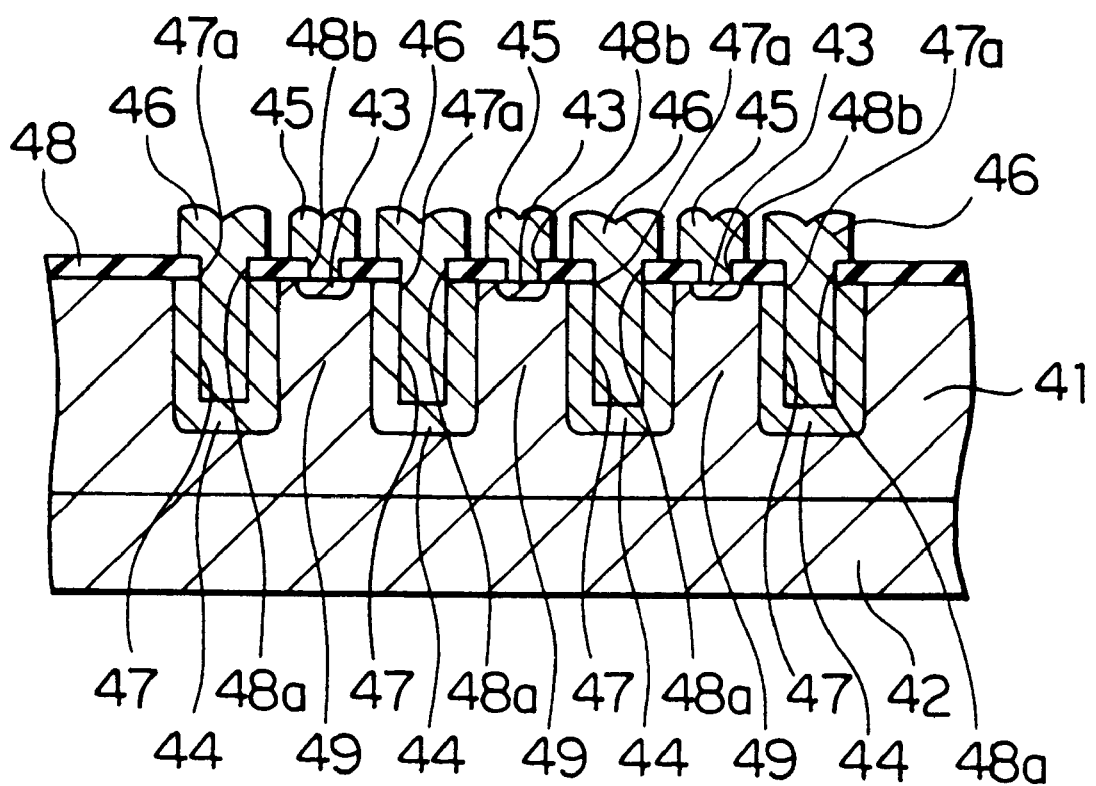
FIG. 2 is a cross-sectional view showing the structure of a junction FET with a vertical structure.
Figure 3:
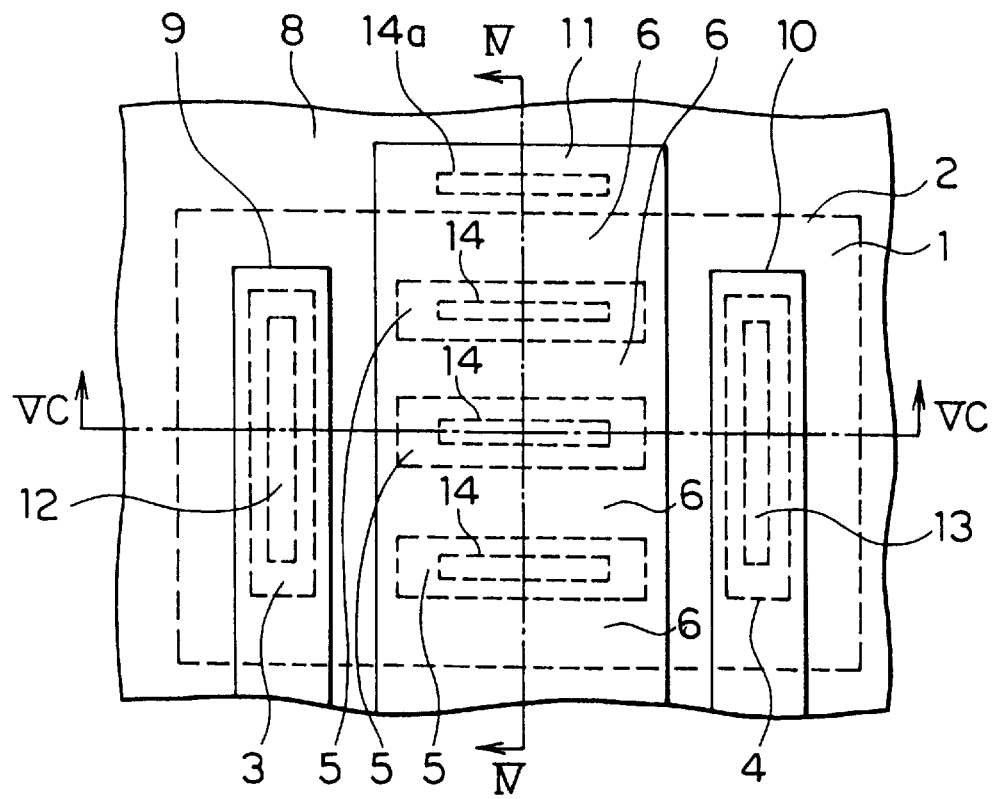
FIG. 3 is a plan view of an N channel junction FET according to the first embodiment of the present invention.
Figure 4:
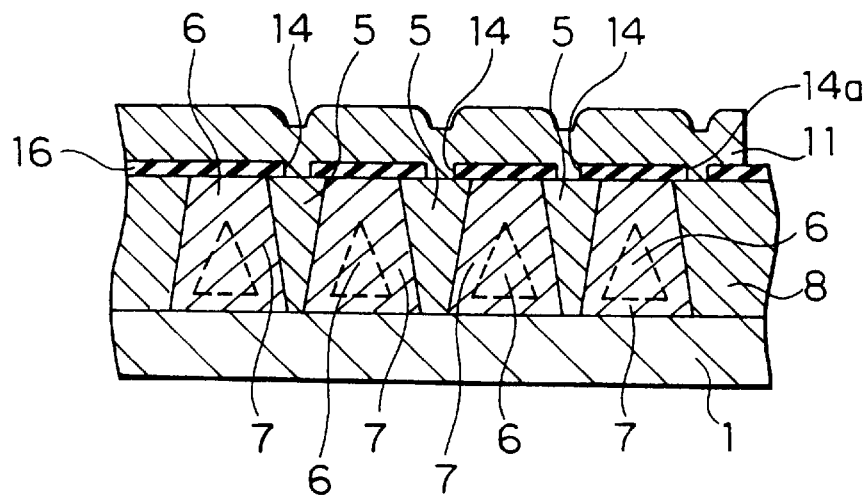
FIG. 4 is an exemplary cross-sectional view along the line IV—IV in FIG. 3.
Figure 5A:
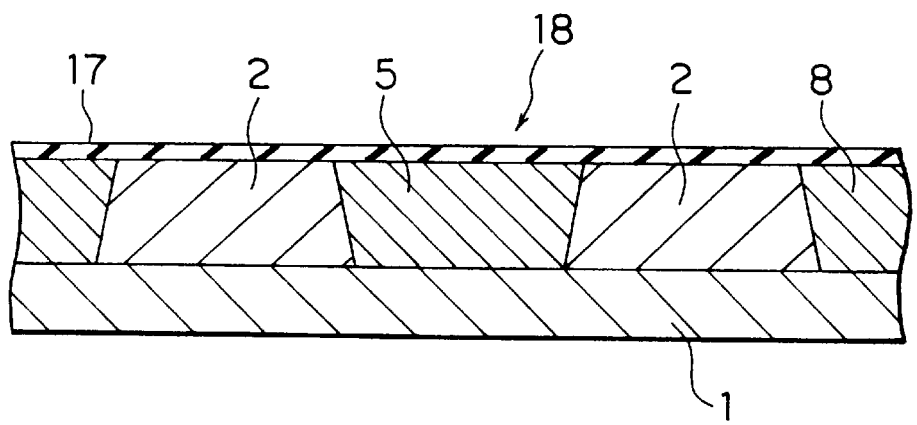
FIGS. 5A through 5C are cross-sectional views illustrating a step-by-step method of fabricating the N channel junction FET according to the first embodiment of this invention.
Figure 5B:
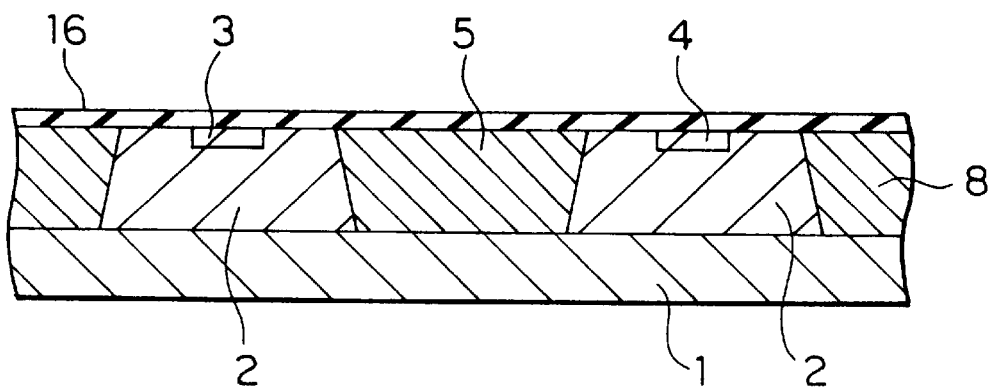
Figure 5C:
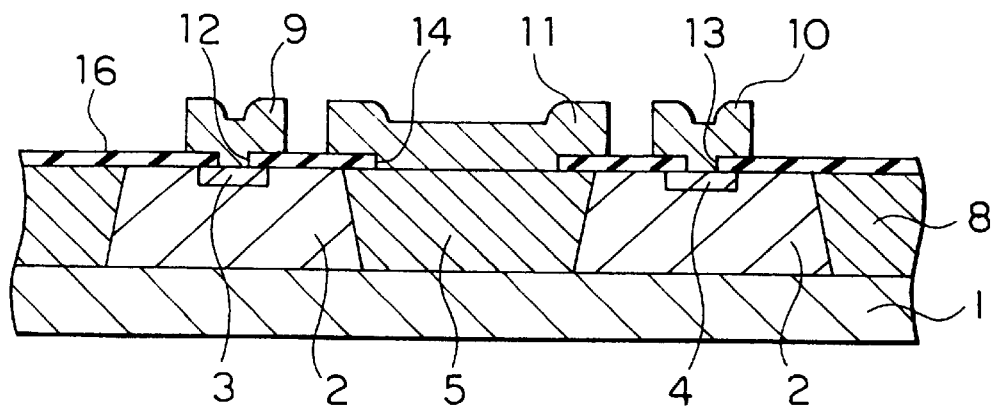

FIG. 3 is a plan view of an N channel junction FET according to the first embodiment of the present invention, FIG. 4 is an exemplary cross-sectional view along the line IV—IV in FIG. 3, and FIGS. 5A through 5C are cross-sectional views illustrating a step-by-step method of fabricating the N channel junction FET according to the first embodiment of this invention. FIG. 5C is a cross-sectional view taken along the line VC—VC in FIG. 3.

As shown in FIG. 5A, an $N^-$ type epitaxial layer (semiconductor layer) 2 with an impurity concentration of, for example, $5 \times 10^{16}$ cm$^{-3}$ is formed 2 $\mu$m thick on a P type semiconductor substrate 1 having an impurity concentration of, for example, $1 \times 10^{15}$ cm$^{-3}$. A P type impurity is diffused from the surface of the $N^-$ type epitaxial layer 2 to reach the P type semiconductor substrate 1, thereby forming a $P^+$ type insulative isolating layer 8 having an impurity concentration of, for example, $5 \times 10^{19}$ cm$^{-3}$ to define a device forming region 18. A plurality of $P^+$ type gate diffusion layers 5 are formed in the device forming region 18. As shown in FIGS. 3 and 4, the $P^+$ type gate diffusion layer 5 has a plate-like shape extending toward the P type semiconductor substrate 1 from the surface of the N type epitaxial layer 2. A plurality of such gate diffusion layers 5 are formed in parallel to and apart from each other. At this time, the $P^+$ type insulative isolating layer 8 and the $P^+$ type gate diffusion layers 5 may be formed in separate steps so that they can have their own predetermined shapes and impurity concentrations. Thereafter, the entire surfaces of the device forming region 18 and the $P^+$ type insulative isolating layer 8 are covered with an insulating film 17.

Then, a resist film (not shown) is formed on the insulating film 17 and openings are selectively formed in the resist film on those area which are apart from both ends of the gate diffusion layers 5 and with such a shape as to extend vertically with respect to the gate diffusion layers 5, as shown in FIG. 5B. With this resist film used as a mask, N type impurity ions are injected into the surface of the $N^-$ type epitaxial layer 2, and then an $N^+$ type source diffusion layer 3 and an $N^+$ type drain diffusion layer 4 are formed by thermal diffusion. Those $N^+$ type source diffusion layer 3 and $N^+$ type drain diffusion layer 4 are apart from both ends of the $P^+$ type gate diffusion layers 5 at predetermined distances, respectively, and are separated from the $P^+$ type insulative isolating layer 8 and the P type single crystalline silicon substrate 1 at predetermined distances, so that the desired characteristics of breakdown voltage are acquired. Then, the resist film and the insulating film 17 are removed and an insulating film 16 is again formed on the $N^-$ type epitaxial layer 2 and $P^+$ type insulative isolating layer 8, etc.

Next, a source contact hole 12, a drain contact hole 13 and first gate contact holes 14 are formed in the insulating film 16 at the positions matching with the source diffusion layer 3, drain diffusion layer 4 and gate diffusion layers 5, as shown in FIG. 5C. At this time, a second gate contact hole 14a is formed in the insulating film 16 at the position matching with the $P^+$ type insulative isolating layer 8, in parallel to and in the same direction as the first gate contact holes 14, as shown in FIGS. 3 and 4. A source electrode 9 and a drain electrode 10 are respectively formed on the source diffusion layer 3 and drain diffusion layer 4, which have been exposed by the contact holes 12 and 13. A gate electrode 11 is so formed as to entirely cover all of the first gate contact holes 14 and the second gate contact hole 14a. Accordingly, the gate electrode 11 is connected to the gate diffusion layers 5 via the first gate contact holes 14 and to the $P^+$ type insulative isolating layer 8 via the second gate contact hole 14a.

In this embodiment, the long sides of three $P^+$ type gate diffusion layers 5 which extend in one direction are formed to be, for example, 4 $\mu$m, and those gate diffusion layers 5 are formed in parallel in a direction perpendicular to this one direction at predetermined distances therebetween. That is, there are four split channel regions 6 between the $P^+$ type gate diffusion layer 5 closest to the $P^+$ type insulative isolating layer 8 and this $P^+$ type insulative isolating layer 8 and between the individual $P^+$ type gate diffusion layers 5, respectively. Those channel regions 6 have the same width.

According to the thus constituted embodiment, when the source potential is increased to +5 V from 0 V under the conditions that the gate potential which is the fixed potential of the P type semiconductor substrate 1, P+ type gate diffusion layers 5 and P+ type insulative isolating layer 8 is set to 0 V and the drain potential is set to 10 V, i.e., when a reverse bias voltage is applied between the gate and source, the depletion layer 7 in the channel region 6 expands from the P+ type gate diffusion layers 5 and P+ type insulative isolating layer 8 to control the drain current as shown in FIG. 4. While the depletion layer 7 also expands from the P type semiconductor substrate 1 in this embodiment, this depletion layer hardly affects the width of the channel region. Therefore, the depletion layer 7 which expands from the P+ type gate diffusion layers 5 is dominant in the channel region located between the P+ type gate diffusion layers 5, while the depletion layer 7 which expands from the P+ type gate diffusion layer 5 and P+ type insulative isolating layer is dominant in the channel region located between the P+ type gate diffusion layer 5 and P+ type insulative isolating layer 8.

Because the channel region 6 is not filled with the depletion layer 7 when the source potential is 0 V, the drain current is determined by the diffusion resistance of the epitaxial layer, whereas when a positive voltage is applied to the source electrode, the channel region 6 is filled with the depletion layer 7, stopping the further flow of the drain current. The voltage ($V_{GS}$(off)) by which the depletion layer fills the channel region to stop the current flow when a reverse bias voltage is applied between the source and gate (a positive voltage applied to the source and a negative voltage to the gate) is determined by the width of the channel region, and $V_{GS}$(off) becomes higher as that width is greater.

Figure 6:
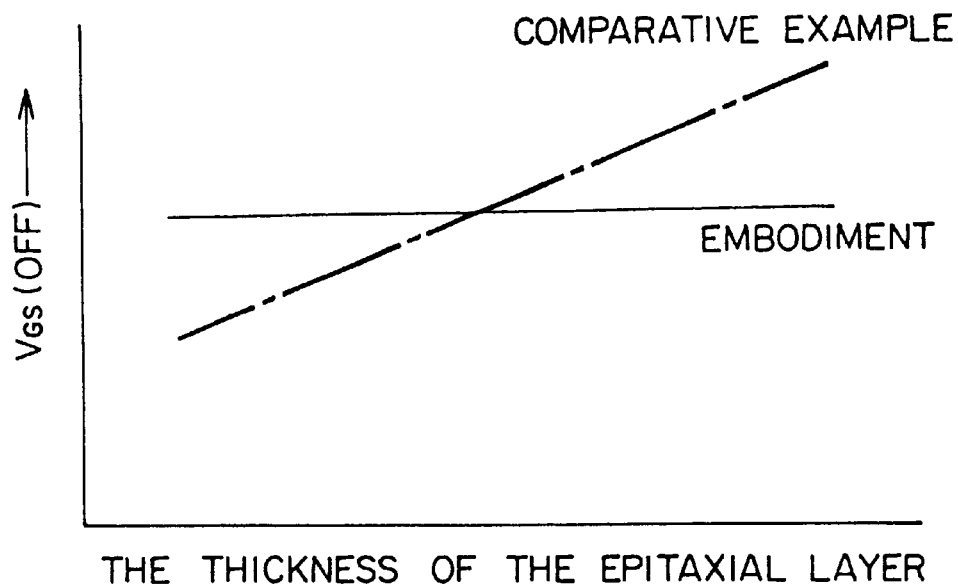
FIG. 6 is a graph showing a change in $V_{GS}$(off) with respect to the thickness of the epitaxial layer, with $V_{GS}$ taken on the vertical scale and the thickness of the epitaxial layer taken on the horizontal scale.

FIG. 6 is a graph showing a change in $V_{GS}$(off) with respect to the thickness of the epitaxial layer, with $V_{GS}$ taken on the vertical scale and the thickness of the epitaxial layer taken on the horizontal scale. The characteristic of the semiconductor device of the first prior art is shown as a comparative example. In the comparative example, the size L of the semiconductor device in the depth direction becomes the width of the channel region, so that the width of the channel region depends on the thickness of the epitaxial layer, by which $V_{GS}$(off) changes. In this embodiment, however, the distances between the P+ type gate diffusion layers 5 and between the P+ type gate diffusion layer 5 and the P+ type insulative isolating layer 8 become the widths of the respective channel regions 6. Even if the thickness of the epitaxial layer 2 changes, therefore, the width of the channel region 6 does not change so that $V_{GS}$(off) is hardly affected by the thickness of the epitaxial layer 2.

Normally, because a variation in the thickness of the epitaxial layer of a junction FET is allowed to be approximately 10% of the maximum film thickness, the conventional junction FET should live with such a degree of variation in the device characteristics. According to this invention, however, a variation in the horizontal expansion of the gate diffusion layers 5 is approximately 5%, it is possible to provide a junction FET whose characteristics vary less than the conventional one.

As the source diffusion layer 3 or the like is not located between the adjoining gate diffusion layers 5, the width of the channel region 6 between the gate diffusion layers 5 can be set freely in accordance with the desired characteristics. Further, the depletion layer 7 expanding from the gate diffusion layers 5 affects the channel region 6 most, and the depletion layer 7 expanding from the substrate 1 is substantially negligible, so that the desired mutual conductance can be acquired regardless of the impurity concentration of the substrate that is needed for other circuit elements.

As the drain diffusion layer 4 and source diffusion layer 3 are formed on the surface side of the semiconductor layer like the epitaxial layer 2, the ON current of this junction FET does not affect the other circuit elements.

Figure 7:
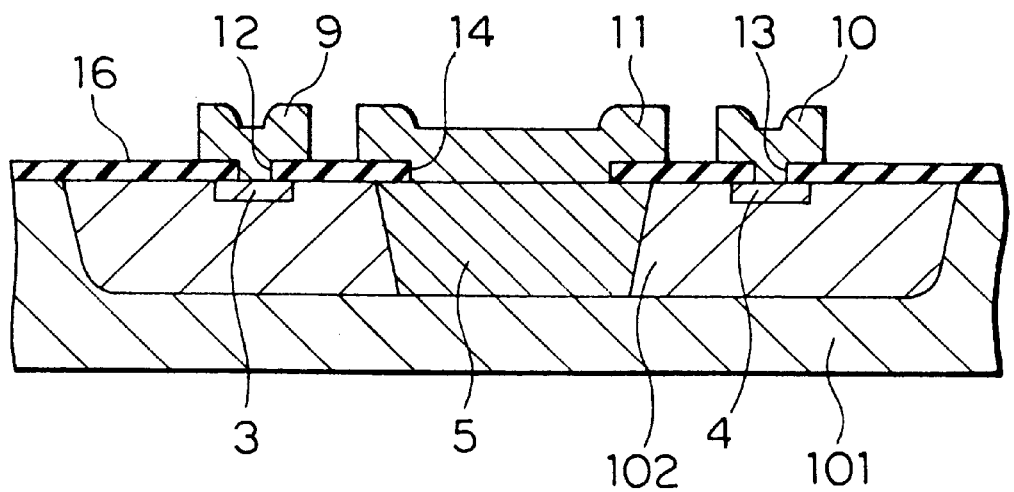
FIG. 7 is an exemplary cross-sectional view showing the structure of the second embodiment of this invention.

FIG. 7 is an exemplary cross-sectional view showing the structure of the second embodiment of this invention. The second embodiment differs from the first embodiment only in that an N type well 102 is formed instead of the N type epitaxial layer 2 as a semiconductor layer, and the other portion of the second embodiment has the same structure as that of the first embodiment. To avoid the redundant and detailed description, therefore, like or same reference numerals are given to those components in FIG. 7 which are the same as the corresponding components in FIGS. 3 through 5.

According to the second embodiment, an N type well (semiconductor layer) 102 is formed on the surface of a P type semiconductor substrate 101, and an N+ type source diffusion layer 3, an N+ type drain diffusion layer 4 and a P+ type gate diffusion layer 5 are formed in the N type well 102, as shown in FIG. 7. An insulating film 16 is formed on the top of those diffusion layers and contact holes 12, 13 and 14 are selectively formed therein. A source electrode 9, a drain electrode 10 and a gate electrode 11 are respectively formed on the N+ type source diffusion layer 3, N+ type drain diffusion layer 4 and P+ type gate diffusion layers 5 where exposed by the contact holes 12, 13 and 14.

According to the thus constituted second embodiment, as a reverse bias voltage is applied between the source and gate, the depletion layer likewise fills the channel region (not shown), so that the drain current can be controlled as per the first embodiment.

In the first and second embodiments shown in FIGS. 3 through 5 and 7, the substrate 1 or 101 is formed by P type single crystalline silicon, and the N− type epitaxial layer 2 or the N type well 102 can be made to an N type silicon epitaxial layer or N type silicon region.

This invention is not limited to the first and second embodiments, but may be modified in various other forms within the scope of the appended claims.

For example, the substrate, layers, regions and so forth may be formed of compound semiconductors, and the P type may be changed to the N type, or vice versa, to provide a P channel junction FET.

Although the foregoing description of those embodiments has discussed the case where the P+ type insulative isolating layer 8 formed for the isolation and insulation of adjoining devices from one another, a field oxide film formed by selective oxidation (LOCOS) and the P+ type insulative isolating layer may be used together.

According to those embodiments, the P+ type gate diffusion layers 5 is so formed as to reach the P type semiconductor substrate 1 by the direct diffusion from the flat top surface of the N type epitaxial layer 2. When the N type epitaxial layer 2 has a thickness of about 5 μm or greater, or when the width of the channel region 6 becomes narrower than the predetermined value by the horizontal diffusion of the P+ type gate diffusion layers 5, however, the P+ type gate diffusion layers 5 may be formed by forming a groove vertically from the flat top surface of the N type epitaxial layer 2 and diffusion a P type impurity from the sides and bottom of that groove.

If one does not want to set the gate potential equal to the substrate potential, the P+ type gate diffusion layers 5 can be so formed as not to reach the P type single crystalline silicon substrate 1. In this case, it is necessary to make the thickness of N type epitaxial layer 2 directly under the P⁺ type gate diffusion layers 5 significantly smaller than the width of the channel region 6 between the P⁺ type gate diffusion layers 5 to prevent the thickness of the epitaxial layer 2 from affecting the electric characteristics.

Further, a single P type gate diffusion layer may be formed in the N type device region defined by the P⁺ type insulative isolating layer and an N type source diffusion layer and N type drain diffusion layer may be formed in the device regions on both sides of the P type gate diffusion layer to form a channel region between the insulative isolating layer and the gate diffusion layer.

What is claimed is:

1. A semiconductor device having a junction FET, comprising:
    a semiconductor layer of first conductivity type;
    a source diffusion layer of first conductivity type selectively formed on a surface of said semiconductor layer;
    a drain diffusion layer of first conductivity type selectively formed on said surface of said semiconductor layer, apart from said source diffusion layer in a first direction;
    a plurality of gate diffusion layers of second conductivity type formed between said source diffusion layer and said drain diffusion layer, apart from one another in a direction perpendicular to said first direction, with first channel regions formed between said gate diffusion layers; and
    a semiconductor substrate of second conductivity type on which said semiconductor layer is formed, said semiconductor substrate having an impurity concentration substantially less than an impurity concentration of said semiconductor layer; and
    wherein said gate diffusion layers are formed as to reach said semiconductor substrate from said surface of said semiconductor layer.

2. The semiconductor device having a junction FET according to claim 1, further comprising:
    an insulating film formed on said semiconductor layer, said insulating film having first gate contact holes at positions matching with said gate diffusion layers; and
    a gate electrode film in contact with all of said gate diffusion layers via said first gate contact holes.

3. The semiconductor device having a junction FET according to claim 1, wherein said source diffusion layer and drain diffusion layer is so formed as to extend in a direction perpendicular to said first direction, and said gate diffusion layers is so formed as to extend in said first direction.

4. The semiconductor device having a junction FET according to claim 1, wherein said semiconductor layer has a flat surface so that said source diffusion layer, drain diffusion layer and gate diffusion layers are formed inward of said semiconductor layer from said surface thereof.

5. The semiconductor device having a junction FET according to claim 1, wherein said semiconductor layer is formed by an epitaxial layer of first conductivity type.

6. The semiconductor device having a junction FET according to claim 1, wherein said semiconductor layer is formed by a well region of first conductivity type in said semiconductor substrate.

7. The semiconductor device having a junction FET according to claim 2, wherein an insulative isolating layer of second conductivity type is formed in such a way as to surround said source diffusion layer, drain diffusion layer and gate diffusion layers.

8. The semiconductor device having a junction FET according to claim 7, wherein said insulative isolating layer of second conductivity type is so formed to reach said semiconductor substrate from said surface of said semiconductor layer.

9. The semiconductor device having a junction FET according to claim 7, wherin said insulating film has a second gate contact hole at a position matching with said insulative isolating layer, and said gate electrode film is in contact with said insulative isolating layer via said second gate contact hole, thereby allowing a second channel region to be formed between one of said gate diffusion layers and said insulative isolating layer of second conductivity type.

10. A semiconductor device having a junction FET, comprising:
    a semiconductor layer of first conductivity type;
    a source diffusion layer of first conductivity type selectively formed on a surface of said semiconductor layer;
    a drain diffusion layer of first conductivity type selectively formed on said surface of said semiconductor layer, apart from said source diffusion layer in first direction;
    a gate diffusion layer of second conductivity type formed between said source diffusion layer and said drain diffusion layer; and
    an insulative isolating layer of second conductivity type so formed as to surround said source diffusion layer, drain diffusion layer and gate diffusion layer, with channel regions formed between said insulative isolating layer and said gate diffusion layer.

11. The semiconductor device having a junction FET according to claim 9, wherein said insulative isolating layer surrounds said source diffusion layer, drain diffusion layer, and gate diffusion layers as to allow a third channel region to be formed between another one of said gate diffusion layers and said insulative isolating layer.

12. The semiconductor device having a junction FET according to claim 11, wherein said first channel regions extend between said second channel region and said third channel region.

13. The semiconductor device having a junction FET according to claim 1, wherein, as a result of the impurity concentration of said semiconductor substrate being substantially less than the impurity concentration of said semiconductor layer, depletion regions expanding from said semiconductor substrate between said gate diffusion layers do not expand into said first channel regions when voltage is applied to at least one of said source diffusion layer, drain diffusion layer, and gate diffusion layers.

14. The semiconductor device having a junction FET according to claim 13, wherein only depletion regions from said gate diffusion layers expand into said first channel regions to control a drain current when voltage is applied to at least one of said source diffusion layer, drain diffusion layer, and gate diffusion layers.

15. The semiconductor device having a junction FET according to claim 9, wherein the impurity concentration of said semiconductor substrate is substantially less than an impurity concentration of said insulative isolating layer, such that a depletion region expanding from said semiconductor substrate between said one of said gate diffusion layers and said insulative isolating layer does not expand into said second channel region when voltage is applied to at least one of said source diffusion layer, drain diffusion layer, and gate diffusion layers.

16. The semiconductor device having a junction FET according to claim 15, wherein only depletions regions from said one of said gate diffusion layers and said insulative isolating layer expand into said second channel region to control a drain current when voltage is applied to at least one of said source diffusion layer, drain diffusion layer, and gate diffusion layer.

17. The semiconductor device having a junction FET according to claim 11, wherein the impurity concentration of said semiconductor substrate is substantially less than an impurity concentration of said insulative isolating layer, such that a depletion region expanding from said semiconductor substrate between said another one of said gate diffusion layers and said insulative isolating layer does not expand into said third channel region when voltage is applied to at least one of said source diffusion layer, drain diffusion layer, and gate diffusion layers.

18. The semiconductor device having a junction FET according to claim 17, wherein only depletions regions from said another one of said gate diffusion layers and said insulative isolating layer expand into said third channel region to control a drain current when voltage is applied to at least one of said source diffusion layer, drain diffusion layer, and gate diffusion layer.

19. The semiconductor device having a junction FET according to claim 10, wherein said semiconductor layer is an n-type well.

* * * * *